(12) United States Patent
Lin et al.

(10) Patent No.: US 7,070,450 B2
(45) Date of Patent: Jul. 4, 2006

(54) INFORMATION DEVICE

(75) Inventors: M. C Lin, Taipei (TW); Jim Liu, Hsinchu (TW); Hank Jan, Taichung (TW)

(73) Assignee: Billionton Systems Inc. (TW)

( * ) Notice: Subject to any disclaimer, the term of this patent is extended or adjusted under 35 U.S.C. 154(b) by 0 days.

(21) Appl. No.: 10/950,438

(22) Filed: Sep. 28, 2004

(65) Prior Publication Data

US 2006/0068638 A1 Mar. 30, 2006

(51) Int. Cl.
*H01R 13/648* (2006.01)
(52) U.S. Cl. .................................................. 439/607
(58) Field of Classification Search ................ 439/607; 174/35 R, 35; 361/752, 759, 796, 737, 424, 361/357–358
See application file for complete search history.

(56) References Cited

U.S. PATENT DOCUMENTS

| | | | | |
|---|---|---|---|---|
| 5,005,106 A | * | 4/1991 | Kiku | 361/818 |
| 5,548,483 A | * | 8/1996 | Feldman | 361/737 |
| 5,739,463 A | * | 4/1998 | Diaz et al. | 174/35 R |
| 6,121,544 A | * | 9/2000 | Petsinger | 174/35 R |
| 6,134,121 A | * | 10/2000 | Braxton | 361/818 |
| 6,775,905 B1 | * | 8/2004 | Tupper | 29/842 |
| 2005/0224005 A1 | * | 10/2005 | Kim | 119/163 |

* cited by examiner

*Primary Examiner*—J. F. Duverne
(74) *Attorney, Agent, or Firm*—Bacon & Thomas

(57) ABSTRACT

An information device includes a control board having a retaining portion mounted thereon, a shell sleeved onto the control board and having an end contacting against the retaining portion, and a sealing cap sleeved onto the other end of the shell. The sealing cap is engaged with the control board, relatively securing the sealing cap and the control board in position and confining the shell between the retaining portion and the sealing cap.

9 Claims, 4 Drawing Sheets

INFORMATION DEVICE

BACKGROUND OF THE INVENTION

1. Field of the Invention

The present invention relates generally to electronic devices, and more particularly to an information device.

2. Description of the Related Art

A common information device, like a portable hard drive, is composed of a controllable-and-memorizable electronic circuit board for accessing data files, a universal serial bus (USB) connector connected with an end of the electronic circuit board for a transfer interface between the electronic circuit board and a matrix (like a computer system), a one-piece shell or a detachable cover shell for protecting the electronic circuit board from dust and humidity, the USB connector extending out of an opening of an end of the shell, and a sealing cap jamming or covering the free end of the shell. The sealing cap is connected with the shell by an adhesive to seal the opening, thereby encapsulating and securing the electronic circuit board in position by the shell and the cap.

However, when the sealing cap is connected with the shell by the adhesive, the adhesive tends to leak either onto the circuit board to defile and spoil the circuit board or outside the shell or the cap to cause inaesthetic appearance of the portable hard drive. In addition, it incurs the long manufacturing time and complex manufacturing procedure.

There is still another conventional portable hard drive, which is also comprised of an electronic circuit board, a shell, and a sealing cap. A screw is threadedly inserted from the outside of shell through the shell, the circuit board, and the cap to combine the same together and to secure the same in position. However, this portable hard drive is inaesthetic in appearance and such threaded connection is complex.

SUMMARY OF THE INVENTION

The primary objective of the present invention is to provide an information device, which is structurally secured in position after the assembly without any other assistant members, like adhesives or screws.

The secondary objective of the present invention is to provide an information device, which is aesthetic in appearance.

The foregoing objectives of the present invention are attained by the information device, which is comprised of a control board having a retaining portion mounted thereon, a shell sleeved onto the control board and having an end contacting against the retaining portion, and a sealing cap sleeved onto the other end of the shell. The sealing cap is engaged with the control board, relatively securing the sealing cap and the control board in position and confining the shell between the retaining portion and the sealing cap.

DETAILED DESCRIPTION OF PREFERRED EMBODIMENTS

Figure 1:
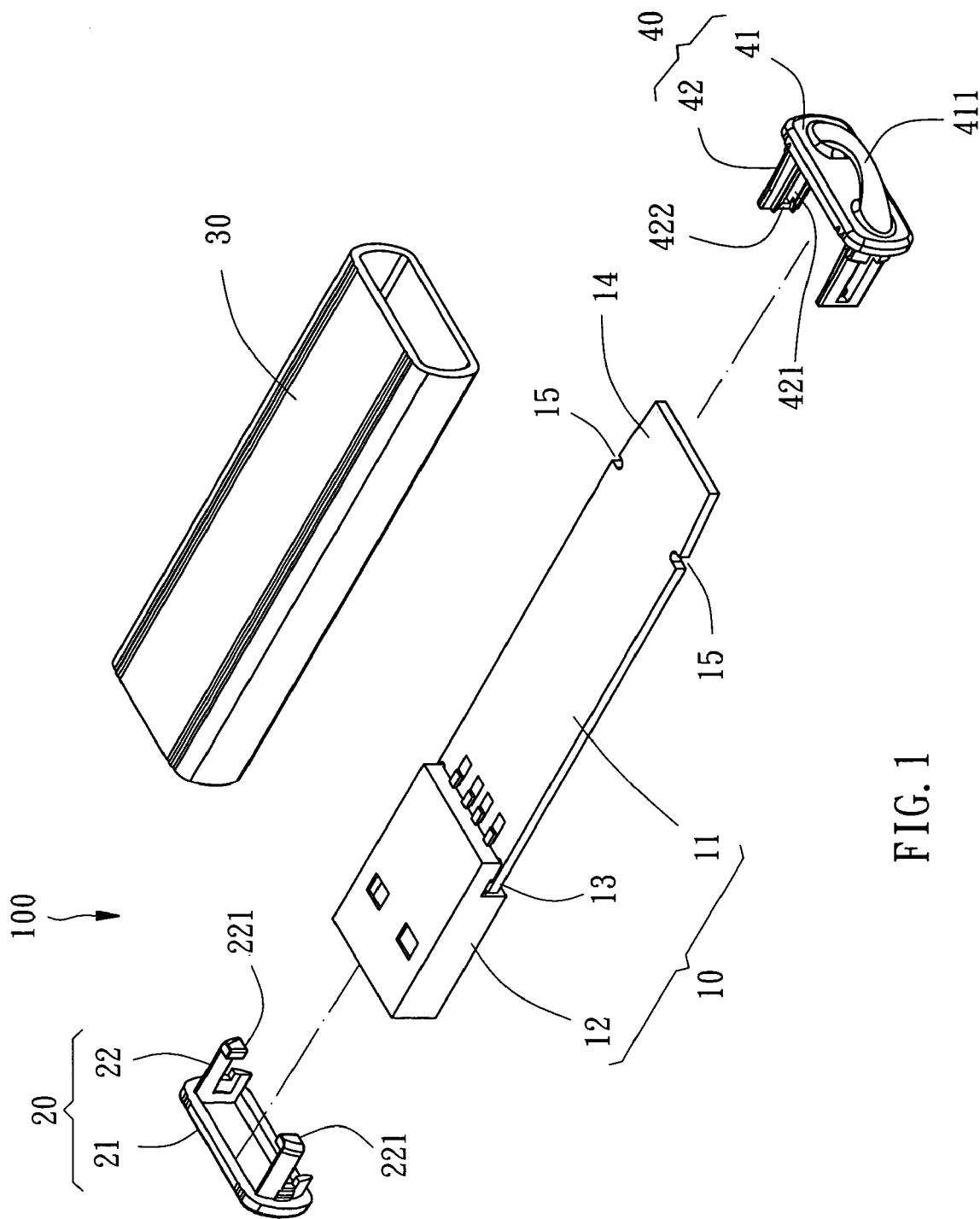
FIG. 1 is an exploded view of a first preferred embodiment of the present invention.

Referring to FIG. 1, an information device 100 constructed according to a first preferred embodiment of the present invention is comprised of a control board 10, a retainer 20, a shell 30, and a sealing cap 40.

The control board 10 includes an electronic circuit board 11 and a connector 12. The electronic circuit board 11 has a plurality of electronic components (not shown), such as a driver chip, a memory chip, an oscillator, a resistor, etc. for saving and loading data, functioning as a miniature hard drive or for wireless communication/transmission. The electronic circuit board 11 defines a first coupling end 13 and a second coupling end 14 at two ends thereof. The first coupling end 13 is provided for connecting the connector 12. The second coupling end 14 is taper-like by decreasingly narrowing its two opposite sides, having two recesses 15 formed at the two opposite sides thereof. The connector 12 is embodied as a plugin USB connector, which has an end fixedly connected with the first coupling end 13 of the circuit board 11 to be electrically connected with the circuit board 11, for connecting a receiver (not shown) of a matrix (not shown), such as a computer system or other electronic apparatuses compatible with the USB connector, functioning as the transfer interface between the matrix (not shown) and the circuit board 11 for the transmission of data, messages, and commands.

The retainer 20 includes a thin frame-like retaining portion 21 and a coupling portion 22. The retaining portion 21 has an inner shape and an inner diameter both substantially identical to an outer shape and an outer diameter of the connector 12. The coupling portion 22 has two claw hooks extending parallel outwards respectively from two opposite sides of the retaining portion 21. An elongated space is defined between the two claw hooks, having an imaginary long axle substantially identical to the outer diameter of the connector 12. Each of the two claw hooks has a lug 221 protruding from a free end thereof towards the elongated space.

The shell 30 is a hollow frame, having an inner diameter that is not larger than an outer diameter of the retaining portion 21.

The sealing cap 40 includes a plate-like stopping portion 41, a clamping portion 42, and a handgrip 411 formed on a side of the stopping portion 41. The clamping portion 42 has two claw hooks extending parallel from two ends of the other side of the stopping portion 41 towards the second coupling end 14. Each of the claw hooks has a ditch 421 of substantially the same width as the thickness of the circuit board 11 at an inner side thereof, and a fending portion 422 protruding from a free end thereof towards the other fending portion 422.

Figure 2:
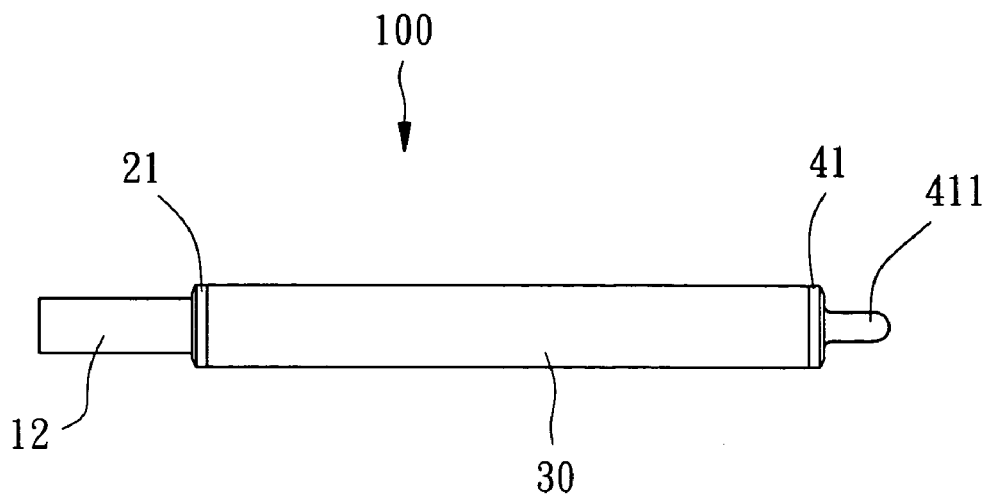
FIG. 2 is a side view of the first preferred embodiment of the present invention.
Figure 3:
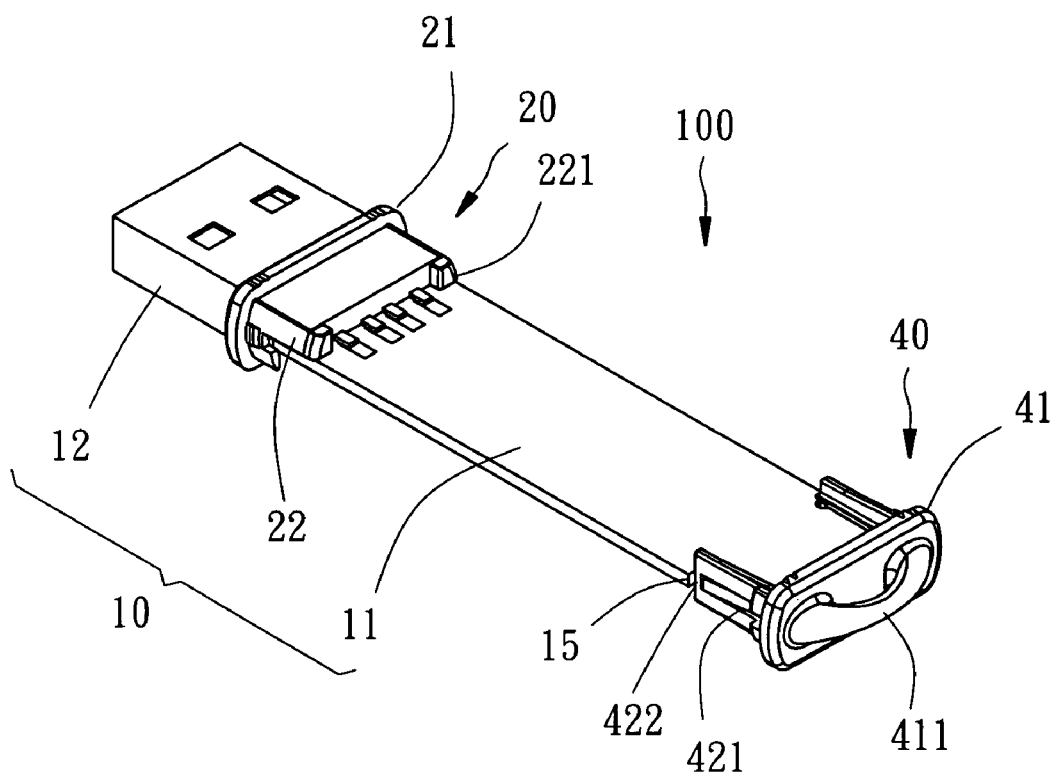
FIG. 3 is a partial perspective view of the first preferred embodiment of the present invention, which shell is removed therefrom.

Referring to FIGS. 2–3, the information device 100 is assembled as recited below. First, the retainer 20 is sleeved onto the connector 12, i.e. the connector 12 is inserted through the retaining portion 21 of the retainer 20 to enable the lugs 221 of the coupling portion 22 to engage an end of the connector 12, thereby securing the retainer 20 and the control board 10 in relative position. Next, the control board 10 is inserted into the shell 30, i.e. the second coupling end 14 of the circuit board 11 is inserted through and out of the shell 30 to enable the retaining portion 21 of the retainer 20 to contact against an end of the shell 30 to further confine the shell 30 in position. Then, put the sealing cap 40 into the other end of the shell 30, i.e. the clamping portion 42 of the sealing cap 40 is inserted into the shell 30 to enable the two opposite sides of the second coupling end 14 to slide respectively into the two ditches 421 of the clamping portions 42 and to further enable the two fending portions 422 to respectively engage the two recesses 15 of the circuit board 15, thereby securing the sealing cap 40 and the control board 10 in position. Further, the stopping portion 41 contacts against the other end of the shell 30. Thus, the shell 30 are confined by the retaining portion 21 and the stopping portion 41 in position at the same time at the two ends thereof to enable the information device 10 to be structurally fully secured in position without assistant members, like adhesives or screws, such that the information device 10 is structurally simplified and is assembled in fewer procedures and less time.

Figure 4:
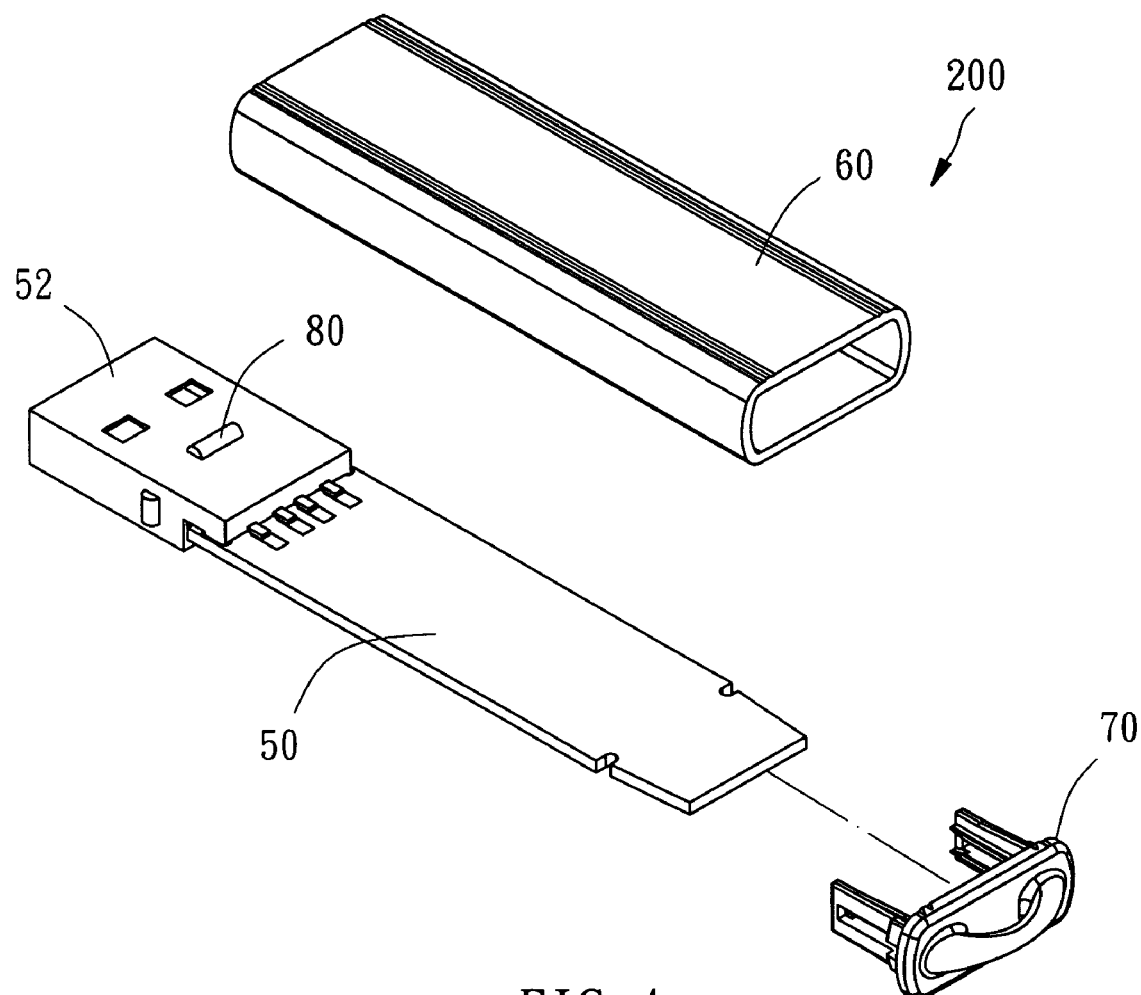
FIG. 4 is an exploded view of a second preferred embodiment of the present invention.
Figure 5:
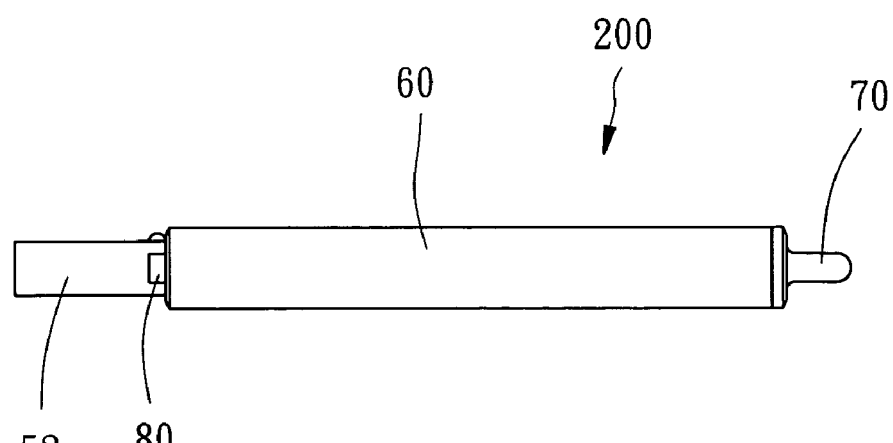
FIG. 5 is a side view of the second preferred embodiment of the present invention.

Referring to FIGS. 4–5, the information device 200 constructed according to a second preferred embodiment of the present invention is comprised of a control board 50, a shell 60, and a sealing cap 70, being similar to the first preferred embodiment but different by that the connector 52 of the control board 50 includes a retaining portion 80, which has a plurality of convex portions each protruding outwards from a side thereof for confining an end of the shell 60 in position.

Figure 6:
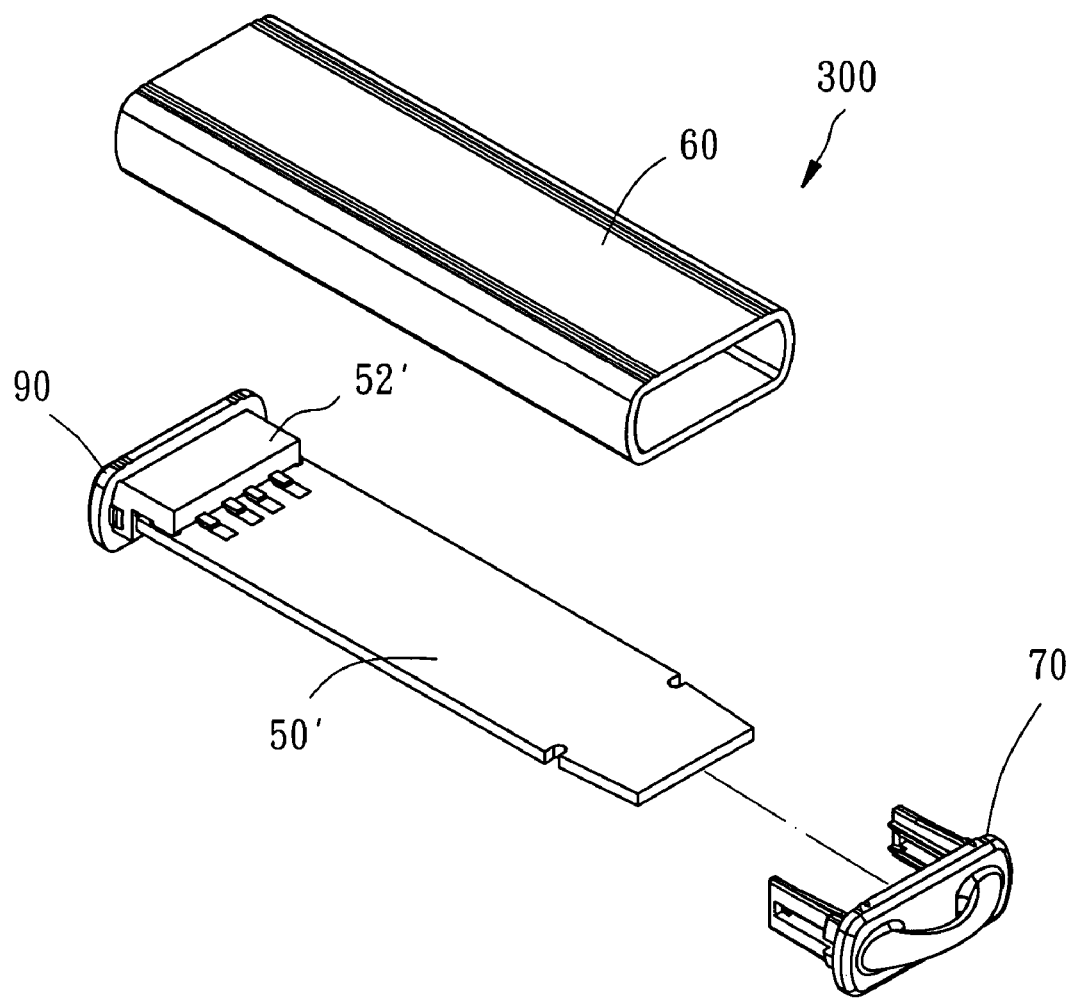
FIG. 6 is an exploded view of a third preferred embodiment of the present invention.
Figure 7:
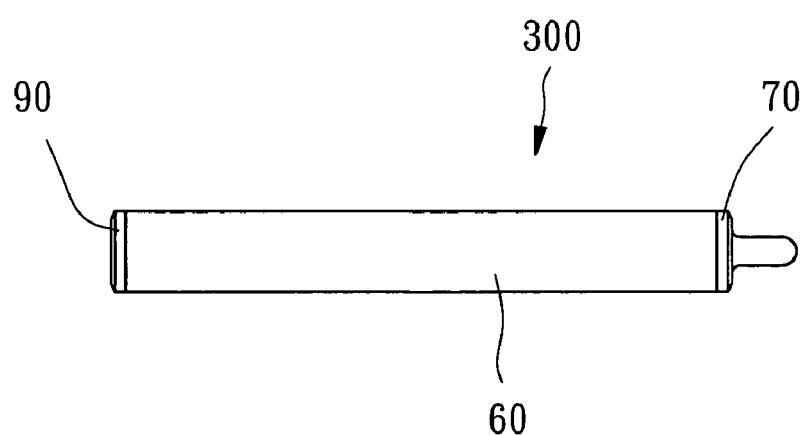
FIG. 7 is a side view of the third preferred embodiment of the present invention.

Referring to FIGS. 6–7, the information device 200 constructed according to a third preferred embodiment of the present invention is comprised of a control board 50', a shell 60, and a sealing cap 70, being similar to the first preferred embodiment but different by that the connector 52' of the control board 50' includes a retaining portion 90 annularly protruding from a free end thereof for stopping an end of the shell 60 in position while the control board 50' is inserted into the shell 60, and the connector 52' is embodied as an infrared connector for transmission via infrared rays. When the control board 50' is inserted into the shell 60, the retaining portion 90 contacts against the shell 60 and the connector 52' is completely covered by the shell 60. Because it is unnecessary to connect the infrared connector 52' and the matrix together, such that the information device 200 is simple and convenient in assembly and small-sized.

In addition, it is to be noted that the connector in addition to the USB connector or the infrared connector can be any other alternative means for information transmission since the connector is provided primarily for connecting the matrix, such as a computer system, information appliances, or other apparatuses capable of logical processing.

Further, the connector can alternatively be an electronic element disposed on the circuit board, such that the retaining portion for confining the shell in position can be also mounted on the circuit board to attain the primary objective of the present invention.

What is claimed is:

1. An information device comprising:

a control board having a circuit unit and a retaining portion;

a shell sleeved onto said control board and having an end contacting against said retaining portion; and a sealing cap sleeved onto the other end of said shell and being engaged with said control board, thereby relatively securing said sealing cap and said control board in position and confining said shell between said retaining portion and said sealing cap;

wherein said control board comprises a coupling end having two decreasingly narrowing opposite sides, said coupling end having two recesses on the two opposite sides of said control board; said sealing cap comprises a plate-like stopping portion and a clamping portion, said clamping portion having two claw hooks extending parallel from two ends of a side of said stopping portion, each of said claw hooks having a ditch and a fending portion, said ditch having substantially the same width as the thickness of said electronic circuit board at its inner side, said fending portion protruding from a free end of one of said claw hooks for jamming said recess and further securely engaging said sealing cap and said control board while said clamping portion is inserted into said shell and then said coupling end of said electronic circuit board slides into said ditches.

2. The information device as defined in claim 1, wherein said control board further comprises an electronic circuit board and a connector, said electronic circuit board being provided for accessing data or for wireless communication/transmission, said connector being electrically connected with said electronic circuit board for an interface of transferring data, messages, and command between said electronic circuit board and an electronic mechanism.

3. The information device as defined in claim 2, wherein said connector is a universal serial bus connector connected with said electronic circuit board.

4. The information device as defined in claim 2, wherein said connector is an infrared means for transmission connected with said electronic circuit board.

5. The information device as defined in claim 2, wherein said retaining portion comprises a plurality of convex portions formed on an external side of said connector.

6. The information device as defined in claim 2, wherein said retaining portion annularly protrudes from an external end of said connector.

7. The information device as defined in claim 2, wherein said connector is an electronic element and is disposed on said electronic circuit board; said retaining portion is formed on said electronic circuit board.

8. The information device as defined in claim 1 further comprising a retainer mounted on said control board, said retainer having a coupling portion; said retaining portion is located on said retainer and connected with said coupling portion, said retaining portion being sleeved onto said control board, said coupling portion being fixed on said control board to secure said retaining portion on said control board.

9. The information device as defined in claim 8, wherein said retaining portion is a frame-like member; said coupling portion comprises two claw hooks extending parallel from two opposite sides of said retaining portion, and two lugs protruding from a free end thereof for engaging said control board.

* * * * *